(12) United States Patent
Rao et al.

(10) Patent No.: US 11,610,837 B2
(45) Date of Patent: Mar. 21, 2023

(54) VIA STRUCTURES OF PASSIVE SEMICONDUCTOR DEVICES

(71) Applicant: GLOBALFOUNDRIES Singapore Pte. Ltd., Singapore (SG)

(72) Inventors: Xuesong Rao, Singapore (SG); Benfu Lin, Singapore (SG); Bo Li, Singapore (SG); Chengang Feng, Singapore (SG); Yudi Setiawan, Singapore (SG); Yun Ling Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 1 day.

(21) Appl. No.: 17/027,661

(22) Filed: Sep. 21, 2020

(65) Prior Publication Data

US 2022/0093508 A1   Mar. 24, 2022

(51) Int. Cl.
*H01L 23/522* (2006.01)
*H01L 23/532* (2006.01)
*H01L 21/768* (2006.01)

(52) U.S. Cl.
CPC .... *H01L 23/5226* (2013.01); *H01L 21/76802* (2013.01); *H01L 21/76883* (2013.01); *H01L 23/5228* (2013.01); *H01L 23/53257* (2013.01)

(58) Field of Classification Search
CPC .......... H01L 23/5226; H01L 21/76802; H01L 23/5228; H01L 23/53257
See application file for complete search history.

(56) References Cited

U.S. PATENT DOCUMENTS

| | | | |
|---|---|---|---|
| 4,836,885 A | 6/1989 | Breiten et al. | |
| 6,221,775 B1 | 4/2001 | Ference et al. | |
| 6,303,490 B1 * | 10/2001 | Jeng | H01L 21/76846 438/653 |
| 6,497,824 B1 | 12/2002 | Chen et al. | |
| 9,679,844 B2 | 6/2017 | Leng et al. | |
| 2007/0040239 A1 * | 2/2007 | Chinthakindi | H01L 23/5228 257/536 |
| 2007/0181974 A1 * | 8/2007 | Coolbaugh | H01L 27/0688 257/E27.047 |
| 2018/0254315 A1 * | 9/2018 | Verma | H01L 21/32051 |
| 2019/0198444 A1 * | 6/2019 | Amanapu | H01L 23/53209 |
| 2021/0217698 A1 * | 7/2021 | Cheng | H01L 23/53257 |

\* cited by examiner

*Primary Examiner* — Phat X Cao
(74) *Attorney, Agent, or Firm* — Anthony Canale

(57) ABSTRACT

A semiconductor device is provided, which includes a dielectric layer and a via structure. The dielectric layer is arranged over a substrate. The via structure is arranged in the dielectric layer, the via structure having a peripheral portion and a central portion. The peripheral portion of the via structure has a height that is greater than that of the central portion.

20 Claims, 6 Drawing Sheets

VIA STRUCTURES OF PASSIVE SEMICONDUCTOR DEVICES

FIELD OF THE INVENTION

The disclosed subject matter relates generally to semiconductor devices, and more particularly to via structures of passive semiconductor devices having improved reliability and methods of forming the same.

BACKGROUND

Components in semiconductor devices typically include active devices and passive devices, among other things. Active devices are components with an ability to electrically control electric charge flow and may include devices such as, but not limited to, transistors, triode vacuum tubes (valves), and tunnel diodes. Passive devices, on the other hand, are components that are incapable of controlling current by means of another electrical signal and may include devices such as, but not limited to, resistors, capacitors, and inductors.

Passive devices generally receive an electric charge flow through via structures for them to perform their functions. A semiconductor device having regions of varying pattern density may present significant challenges in the fabrication of those via structures, thereby affecting the reliability of those via structures and passive devices fabricated thereupon.

Therefore, there is a need to provide via structures of passive semiconductor devices having improved reliability and methods of forming the same to overcome, or at least ameliorate, the disadvantage described above.

SUMMARY

To achieve the foregoing and other aspects of the present disclosure, via structures of passive semiconductor devices and methods of forming the same are presented.

According to an aspect of the present disclosure, a semiconductor device is provided, which includes a dielectric layer and a via structure. The dielectric layer is arranged over a substrate. The via structure is arranged in the dielectric layer, the via structure having a peripheral portion and a central portion, and that the peripheral portion has a height that is greater than that of the central portion.

According to another aspect of the present disclosure, a method of forming a semiconductor device is provided, which includes providing a substrate and forming a dielectric layer having a first region and a second region over the substrate. A via structure is fabricated in the first region of the dielectric layer. The via structure has a peripheral portion and a central portion, the peripheral portion having a height greater than that of the central portion.

BRIEF DESCRIPTION OF THE DRAWINGS

The embodiments of the present disclosure will be better understood from a reading of the following detailed description, taken in conjunction with the accompanying drawings.

Figure 1A:
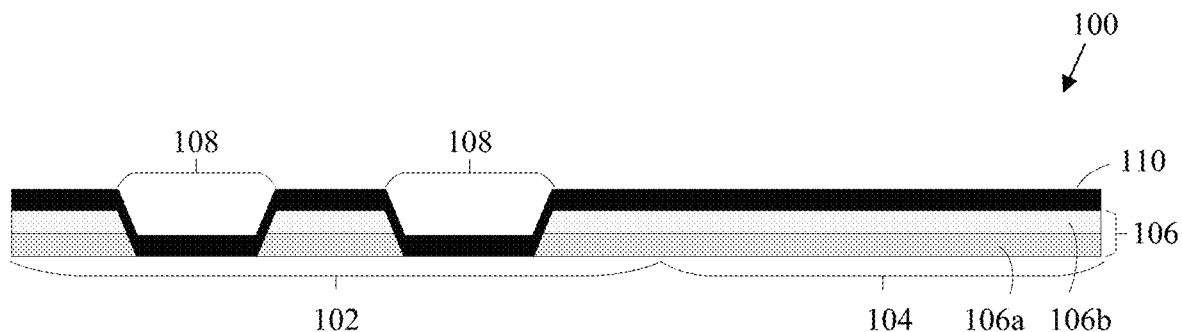
FIGS. 1A to 1E are cross-sectional views of a semiconductor device, illustrating a method of fabricating the semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to via structures of passive semiconductor devices having improved reliability and methods of forming the same.

In general, a semiconductor device may have regions of varying pattern density. There may be one or more regions of high pattern density (i.e., a region having devices being packed relatively closer together) and one or more regions having low pattern density (i.e., a region having devices being packed relatively further apart). A device in a high pattern density region may be termed as a "high density" or "dense" device, while a device in a low pattern density region may be termed as a "low density" or "isolated" device.

The regions of varying pattern density may induce isolated/dense (I/D) loading effects that present significant challenges in the fabrication process of the semiconductor device. For example, a planarization process, though providing a relatively high material removal rate, may cause more significant erosion of dielectric material at a region of higher pattern density than that at a region of lower pattern density.

Erosion of the dielectric material may cause undesirable defects, e.g., delamination or cracking of the dielectric material, and also presents uniformity challenges for subsequent fabrication processes. During the fabrication process, compromises between profiles, selection ratio, and center-to-edge non-uniformity may be unavoidable. It is therefore imperative to minimize erosion of dielectric material during the fabrication process, such that potential defects resulting from the inherent I/D loading effects may be reduced and a semiconductor device achieving higher reliability may be fabricated.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Certain structures may be conventionally fabricated, for example, using known processes and techniques, and specifically disclosed processes and methods may be used to achieve individual aspects of the present disclosure.

FIG. 1A to 1E are cross-sectional views of a semiconductor device 100, illustrating various stages of forming the semiconductor device 100, according to embodiments of the disclosure.

The semiconductor device 100 may be part of a semiconductor integrated circuit (IC) device. The semiconductor device 100 may include a first region 102 and a second region 104. The first region 102 may be a device region defined to form a passive device and the second region 104 may be a non-device region or an active device region defined to form other semiconductor active devices, although those active devices are not shown in the accompanying drawings.

As illustrated in FIG. 1A, a dielectric layer 106 may be fabricated over a substrate (not shown) and may include a plurality of openings 108 fabricated therein. The dielectric layer 106 may include a dielectric material that is suitable to at least electrically isolate conductive features fabricated therein from adjacent conductive features. The dielectric layer 106 may be a single-layered dielectric layer or a multi-layered dielectric stack.

In this embodiment of the disclosure, the dielectric layer 106 is a multi-layered dielectric stack that may include a first dielectric portion 106a and a second dielectric portion 106b over the first dielectric portion 106a. The first dielectric portion 106a may serve as a capping layer to prevent electro-migration and/or oxidation of conductive material beneath the dielectric layer 106 and may include silicon nitride, silicon carbonitride, silicon carbide, or combinations thereof. The second dielectric portion 106b may include tetraethyl orthosilicate (TEOS). Other dielectric materials known in the art may also be employed.

The plurality of openings 108 has effectuated regions of varying pattern density over the semiconductor device 100. Specifically, the first region 102 is a region of relatively higher pattern density where the plurality of openings 108 has been fabricated therein and the second region 104 is a region having relatively lower pattern density. In an embodiment of the disclosure, the second region 104 may be a non-device region having substantially planar topography.

A layer of via material 110 may be deposited over the dielectric layer 106, including over sidewalls of the dielectric layer 106 and bottom surfaces that defined the openings 108 in the first region 102. The via material 110 may include a suitable conductive material that is compatible with the passive device that is to be fabricated thereupon. In an embodiment of the disclosure, the via material may include a tantalum-containing conductive material, such as but not limited to, tantalum or tantalum nitride.

The via material 110 may be fabricated using a deposition technique. As used herein, "deposition techniques" refer to the process of applying a material over another material (or the substrate). Exemplary techniques for a deposition process include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD). In an embodiment of the disclosure, the via material 110 is deposited with a PVD process.

Figure 1B:
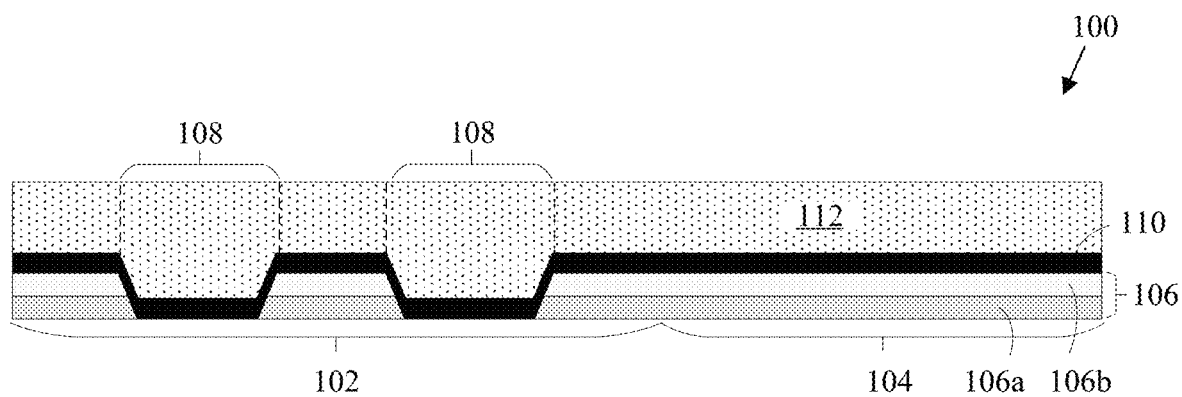

FIG. 1B illustrates the semiconductor device 100 after depositing a mask layer 112, according to an embodiment of the disclosure. The mask layer 112 may be deposited over the via material 110 and may be preferable to include a material that can be deposited with a substantially planar topography, for example, a photoresist material that may be deposited with a spin-on coating process.

Figure 1C:
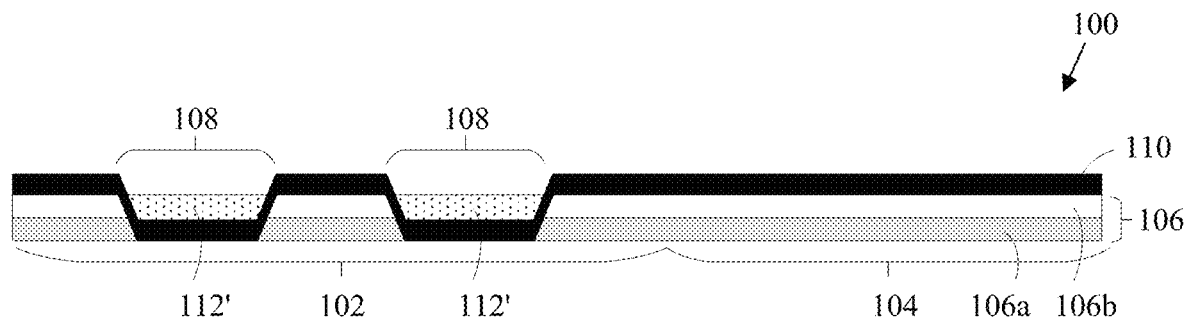

FIG. 1C illustrates the semiconductor device 100 after recessing the mask layer 112, according to an embodiment of the disclosure. The mask layer 112 may be recessed using a material removal technique. The material removal technique employed is preferably selective to the via material 110, i.e., the via material 110 remains predominantly intact during recessing of the mask layer 112 using the material removal technique. In an embodiment of the disclosure, the material removal technique may include an etching process.

The mask layer 112 may be recessed until portions of the via material 110 that is over an upper surface of the dielectric layer 106 have been exposed, i.e., the recessed mask layer 112' remains in the openings 108. In an embodiment of the disclosure, the recessed mask layer 112' may have a thickness that at most extends to the upper surface of the via material 110; i.e., the recessed mask layer 112' having an upper surface that is coplanar with the upper surface of the via material. As illustrated in FIG. 1C, the recessed mask layer 112' extends to the upper surface of the dielectric layer 106.

In an embodiment of the disclosure, the recessed mask layer 112' may be fabricated by an exemplary material removal process described herein. The mask layer 112 may be first recessed using an end-point system. The end-point system can indicate when the portion of the via material 110 over the upper surface of the dielectric layer 106 has been detected. The material removal process may continue to recess the mask layer 112 until the recessed mask layer 112' has a thickness that at most extends to the upper surface of the via material 110.

Figure 1D:
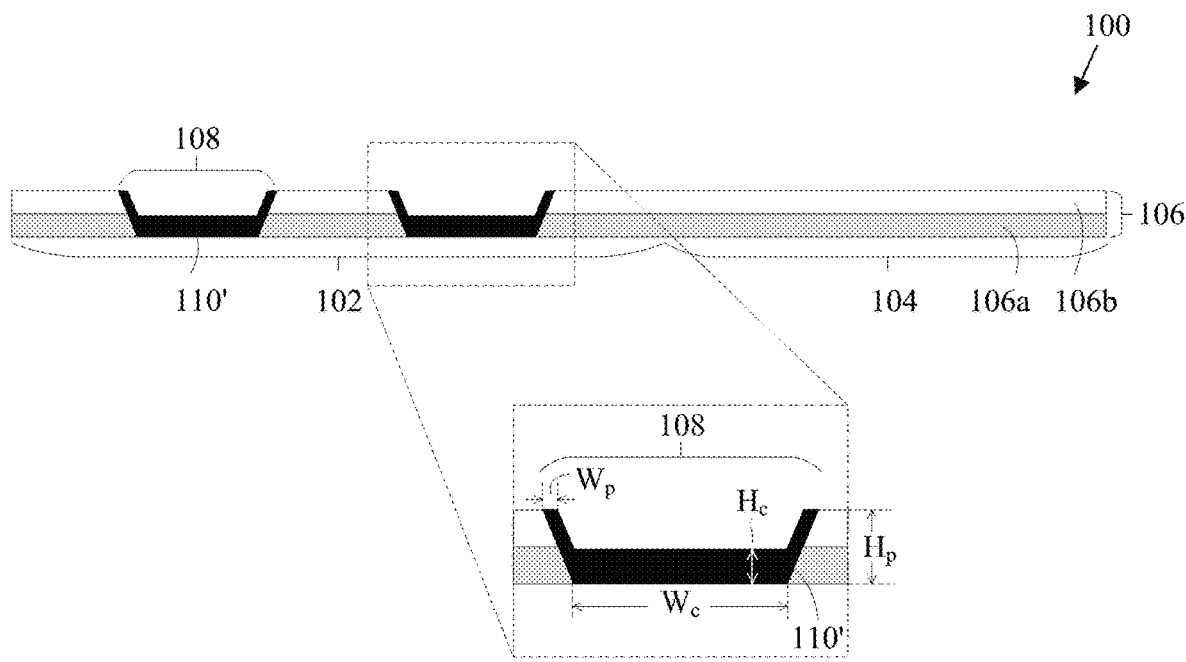

FIG. 1D illustrates the semiconductor device 100 after fabricating a via structure 110' in the opening 108, according to an embodiment of the disclosure. The exposed portions of the via material 110 may be removed using a material removal technique; the material removal technique uses the recessed mask layer 112' as a masking feature to form the via structure 110'. In an embodiment of the disclosure, the material removal technique may be an etching process such as, but not limited to, a reactive ion etching (RIE) process. The recessed mask layer 112' may be subsequently removed using another material removal technique such as, but not limited to, a resist stripping process.

The portion of the via material 110 masked by the recessed mask layer 112' may remain substantially intact as the recessed mask layer 112' may serve as a protective mask over the via material 110 during the application of the material removal technique. The via structure 110' substantially conforms to the shape of the opening 108 and may have a peripheral portion that overlays the sidewalls of the dielectric layer 106 and a central portion that overlays the bottom surface that defined the opening 108. In an embodiment of the disclosure, the via structure 110' may acquire a concave profile or a U-shaped profile in the opening 108.

The peripheral portion of the via structure 110' may have a height $H_p$ that is greater than a height $H_c$ of the central portion and a width $W_p$ that is narrower than a width $W_c$ of the central portion. In an embodiment of the disclosure, the central portion of the via structure 110' may have a height $H_c$ in a range between 30 nm to 150 nm.

The height $H_p$ of the peripheral portion of the via structure 110' may be dependent on the thickness of the recessed mask layer 112'. For example, the peripheral portion of the via structure 110' may have an upper surface that is substantially level with the upper surface of the dielectric layer 106 when the thickness of the recessed mask layer 112' extends to the upper surface of the dielectric layer 106. In another example, the peripheral portion of via structure 110' may have an upper surface that is lower than the upper surface of the dielectric layer 106 when the thickness of the recessed mask layer 112' is at a level below the upper surface of the dielectric layer 106. In an embodiment of the disclosure, the peripheral portion of the via structure 110' may have a height $H_p$ in a range between 50 to 200 nm.

A typical material removal technique to remove the exposed portions of the via material 110 is a planarization technique. A planarization technique provides a relatively high material removal rate but causes more significant dielectric material erosion in the first region 102 having a relatively higher pattern density than that of the second region 104 having a relatively lower pattern density. By removing the exposed portions of the via material 110 using an etching process, potential erosion of the dielectric layer 106 at the first region 102, that may be caused by a planarization technique due to the inherent VD loading effects, may be advantageously reduced, i.e., the thickness of the dielectric layer 106 at the first region 102 substantially equals the thickness of the dielectric layer 106 at the second region 104. It is an aspect of the disclosure that the thickness of the dielectric layer 106 at the first and second regions 102, 104 is predominantly maintained with reduced erosion effects such that the dielectric layer 106 at the first region 102 has an upper surface that is substantially level with an upper surface of the dielectric layer 106 at the second region 104.

It may be preferable to completely remove the portions of the via material 110 that are over the upper surface of the dielectric layer 106. The presence of residual via material 110 may adversely cause defect issues or cause an electrical shortage to adjacent conductive features. Therefore, the thickness of the recessed mask layer 112' should preferably not extend beyond the upper surface of the via material 110 such that the material removal technique can effectively remove the portions of the via material 110 that are not masked by the recessed mask layer 112'.

It should be appreciated that the thickness of the recessed mask layer 112' may be optimized further when necessary, such as recessing the mask layer 112 to a level below the upper surface of the dielectric layer 106, to completely remove any residual via material 110 over the upper surface of the dielectric layer 106. In an embodiment of the disclosure, the via structure 110' in the opening 108 may serve as an electrical pathway for a thin film resistor (TFR) that will be fabricated in the subsequent fabrication process.

Figure 1E:
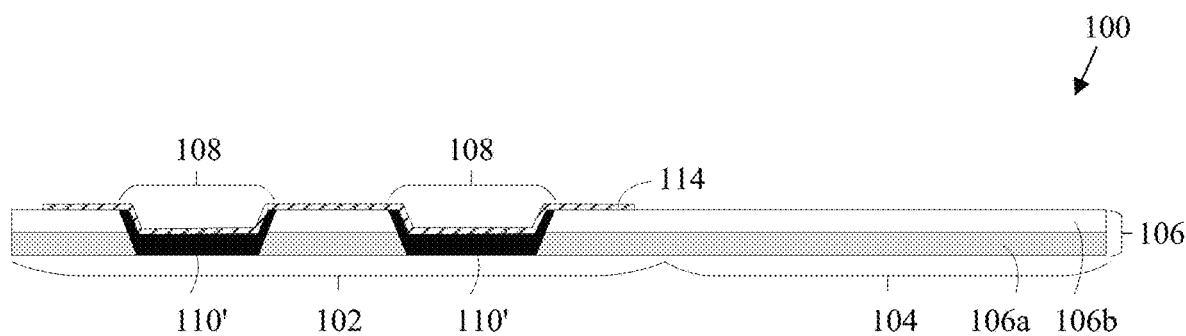

FIG. 1E illustrates the semiconductor device 100 after forming a conductive layer 114 in the first region 102. A layer of conductive material may be deposited over the first and second regions 102, 104 using a deposition technique. The deposition technique is preferably a conformal deposition process. The layer of conductive material may be deposited over the dielectric layer 106 and the via structures 110' in the openings 108. The conductive layer 114 may acquire a non-planar topography; the non-planarity arises at the openings 108 where the conductive layer 114 overlays the via structures 110'. In an embodiment of the disclosure, at least a portion of the conductive layer 114 conforms to the profile of the via structure 110' in the opening 108, and a portion of the conductive layer 114 overlays the upper surface of the dielectric layer 106.

The layer of conductive material may be patterned using a patterning technique to form the conductive layer 114 in the first region 102. In an embodiment where a TFR 15 to be fabricated, the conductive layer 114 may include a resistive material to form the TFR and may include a transition metal alloy, for example, silicon chromium (SiCr), nickel chromium (NiCr), silicon carbide chromium (SiCCr), tantalum nitride (TaN), tantalum silicon nitride (TaSiN), aluminum-doped nickel chromium (AlNiCr), titanium nickel chromium (TiNiCr), or combinations thereof. Other conductive materials known in the art may also be employed, depending on the type of passive device that is to be fabricated.

FIGS. 2A to 2D are cross-sectional views of a semiconductor device 200, illustrating another method of forming the semiconductor device 200, according to embodiments of the disclosure.

Figure 2A:
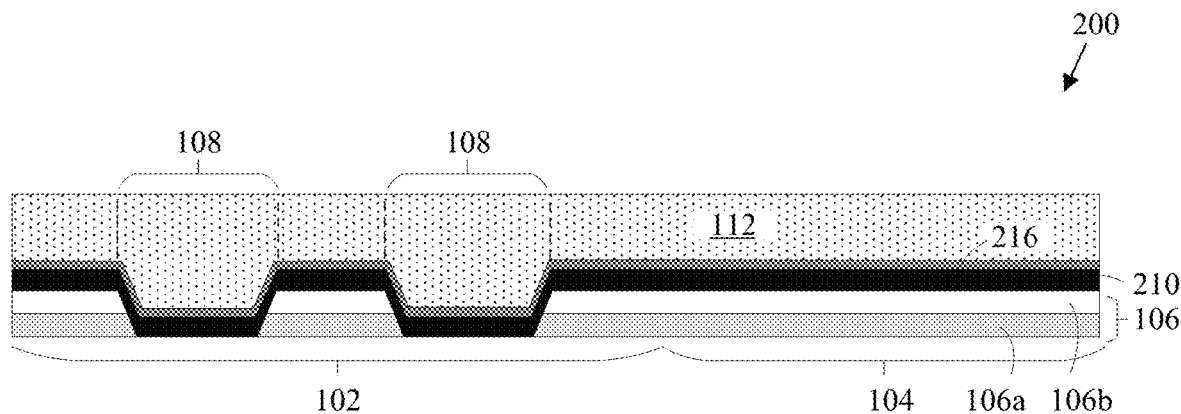
FIGS. 2A to 2D are cross-sectional views of a semiconductor device, illustrating another method of fabricating the semiconductor device, according to an alternative embodiment of the disclosure.

FIG. 2A continues from the embodiment shown in FIG. 1A. A layer of via material 210 may be fabricated over the first and second regions 102, 104 of the semiconductor device 200 and a barrier layer 216 and a mask layer 112 may be fabricated over the via material 210, according to an embodiment of the disclosure. The barrier layer 216 may be deposited using a deposition technique; the deposition technique being preferably a conformal deposition process. The mask layer 112 may be subsequently deposited over the barrier layer 216 using another deposition technique.

The barrier layer 216 may include a dielectric material that is suitable to at least isolate the mask layer 112 from the via material 210. Direct deposition of the mask layer 112 over the via material 210 may pose potential contamination challenges that may affect the electrical connectivity of the passive device that is to be fabricated thereupon. By forming an intervening barrier layer 216 between the via material 210 and the mask layer 112, potential contamination resulting from the mask layer 112 may be reduced. The barrier layer 216 may include a dielectric material such as, but not limited to, silicon nitride or TEOS.

Figure 2B:
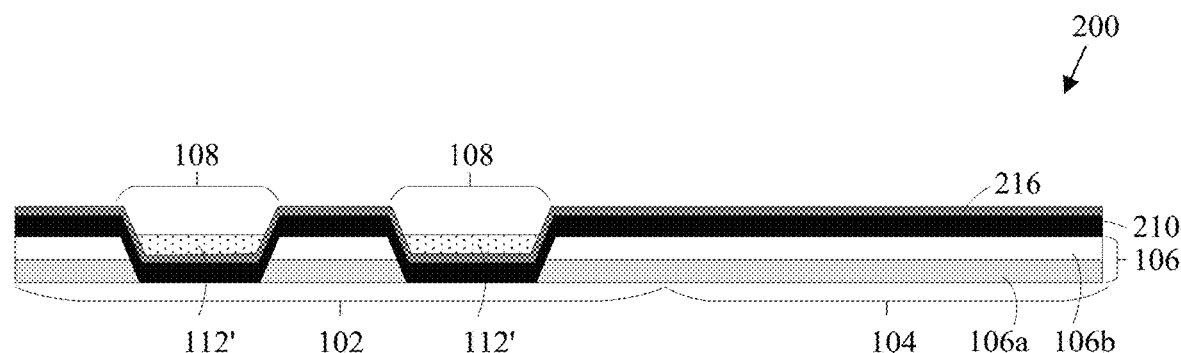

FIG. 2B illustrates the semiconductor device 200 after recessing the mask layer 112, according to an embodiment of the disclosure. Similar to the fabrication process described in FIG. 1C, the mask layer 112 may be recessed using a material removal technique that is preferably selective to the via material 210. The mask layer 112 may be recessed until the recessed mask layer 112' has a thickness that at most extends to the upper surface of the via material 210. Portions of the barrier layer 216 that are over the upper surface of the dielectric layer 106 are exposed after recessing the mask layer 112.

It may be preferable that the thickness of the recessed mask layer 112' does not extend beyond the upper surface of the layer of via material 210 such that the material removal technique can effectively remove the portions of the via material 210 that are over the upper surface of the dielectric layer 106 in subsequent fabrication processes.

Figure 2C:
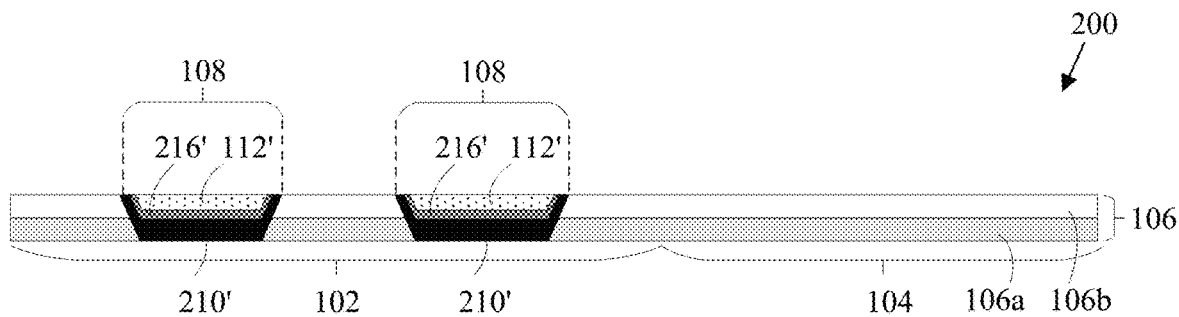

FIG. 2C illustrates the semiconductor device 200 after removing portions of the exposed barrier layer 216 and those portions of the via material 210 under the exposed barrier layer 216, according to an embodiment of the disclosure. Using the recessed mask layer 112' in the openings 108 as masking features, the exposed barrier layer 216 and those portions of the via material 210 under the exposed barrier layer 216 may be removed using a material removal technique. The material removal technique may be a one-step or multi-step process.

In an embodiment of the disclosure, the material removal technique is a multi-step process. The exposed barrier layer 216 may be removed using a first material removal process, exposing the via material 210 underneath. The exposed via material 210 may be subsequently removed using a second material removal process to form via structures 210'. In this embodiment of the disclosure, the multi-step process includes an etching process.

In another embodiment of the disclosure, the exposed barrier layer 216 and the portion of the via material 210 underneath thereof may be removed using a one-step material removal technique. The recessed mask layer 112' serves as a protective mask over the barrier layer 216 during the material removal technique. In this embodiment of the disclosure, the one-step material removal technique includes an etching process.

As disclosed earlier, it is an aspect of the disclosure that the thickness of the dielectric layer 106 at the first and second regions 102, 104 is predominantly maintained with reduced erosion effects. By removing the portions of the via material 210 using an etching process, the inherent I/D loading effects from an application of a planarization technique may be diminished, and accordingly, potential erosion of the dielectric layer 106 at the first region 102 may be advantageously reduced.

Figure 2D:
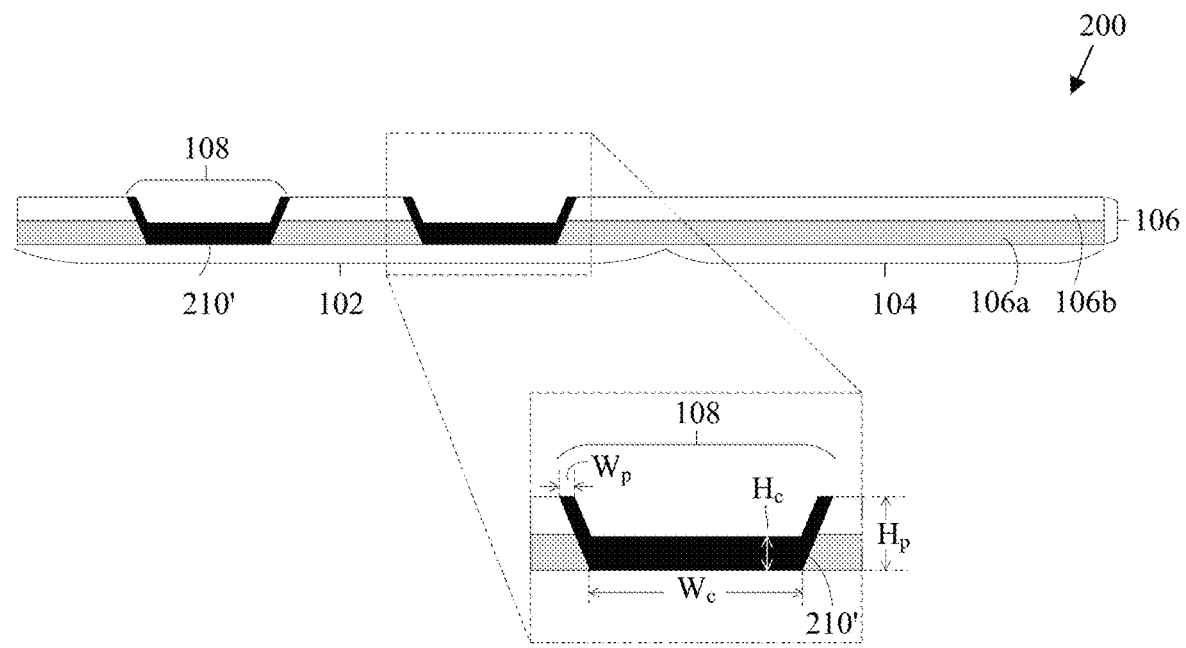

FIG. 2D illustrates the semiconductor device 200 after removing the recessed mask layer 112' and the patterned barrier layer 216' from the openings 108, according to an embodiment of the disclosure. The recessed mask layer 112' and the patterned barrier layer 216' may be removed using a one-step or a multi-step material removal technique. For example, the recessed mask layer 112' may be removed using a first material removal process and the patterned barrier layer 216' may be subsequently removed using a second material removal process. In another example, the recessed mask layer 112' and the patterned barrier layer 216' may be removed using a one-step material removal process.

Similar to the via structure 110' in FIG. 1D, the via structure 210' may substantially conform to the shape of the opening 108 and has a peripheral portion that overlays the sidewalls of the dielectric layer 106 and a central portion that overlays the bottom surface that defined the opening 108. The peripheral portion of the via structure 210' may have a height $H_p$ that is greater than a height $H_c$ of the central portion and a width $W_p$ that is narrower than a width $W_c$ of the central portion. The peripheral portion of the via structure 210' may have an upper surface that is substantially level with or lower than the upper surface of the dielectric layer 106. In an embodiment of the disclosure, the via structure 210' may acquire a concave profile or a U-shaped profile in the opening 108.

In an embodiment of the disclosure, the via structures 210' in the openings 108 may serve as an electrical pathway for a passive semiconductor device that will be fabricated in the subsequent fabrication process.

Similar to the embodiment of the semiconductor device 100 in FIG. 1E, a conductive layer (not shown), that may be analogous to the conductive layer 114 in FIG. 1E, may be fabricated in the first region 102, electrically coupling to the via structures 210' in the openings 108. In an embodiment of the disclosure, the conductive layer forms a non-planar TFR; the non-planarity arises at the openings 108 where the TFR overlays the via structures 210'.

Figure 3A:
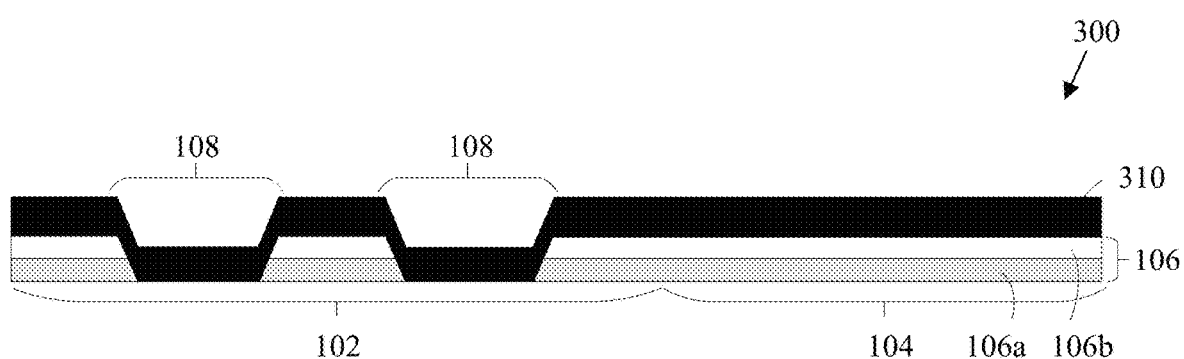
FIGS. 3A to 3C are cross-sectional views of a semiconductor device, illustrating yet another method of fabricating the semiconductor device, according to another alternative embodiment of the disclosure.
Figure 3B:
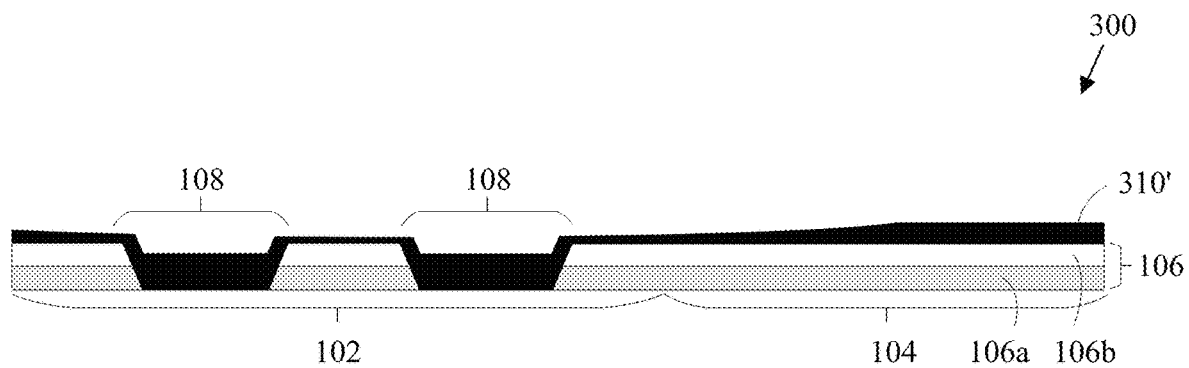
Figure 3C:
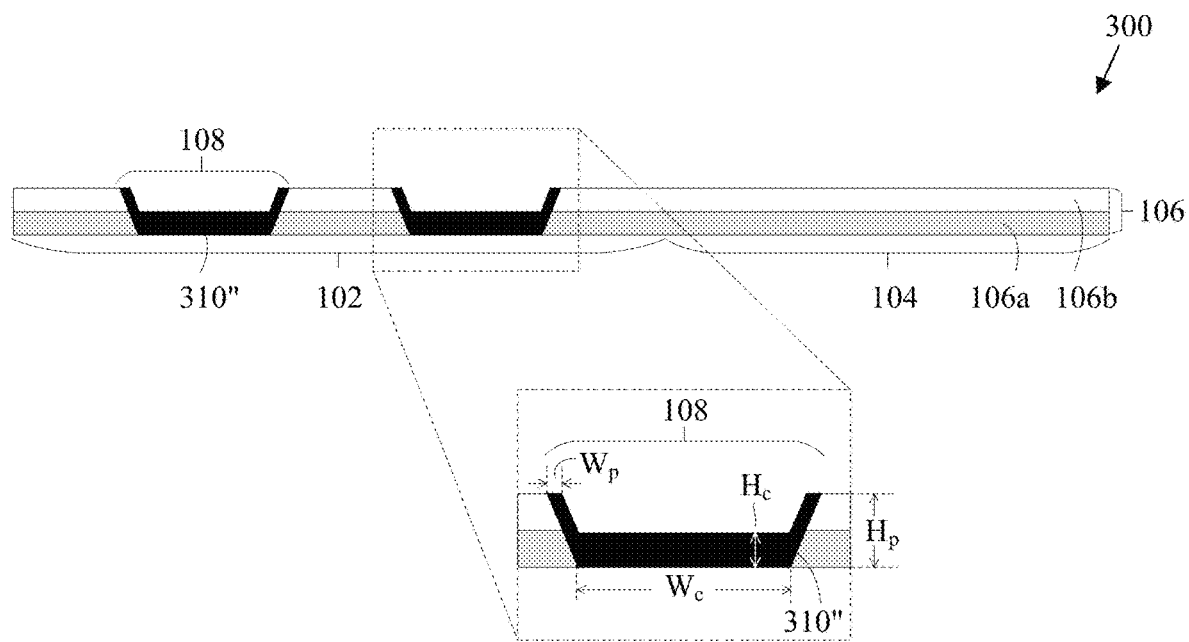

FIGS. 3A to 3C are cross-sectional views of a semiconductor device 300, illustrating yet another method of forming the semiconductor device 300, according to embodiments of the disclosure.

The embodiment of the semiconductor device 300 in FIG. 3A is similar to the embodiment of the semiconductor device 100 in FIG. 1A, in that the semiconductor device 300 also includes a first region 102, a second region 104, and a dielectric layer 106 over the first and second regions 102, 104; the first region 102 where the dielectric layer 106 has a plurality of openings 108 fabricated therein to effectuate a relatively higher pattern density and the second region 104 being a region of lower pattern density relative the first region 102. The semiconductor device 300 further includes a layer of via material 310 fabricated over the first and second regions 102, 104.

The difference between the embodiment of the semiconductor device 300 in FIG. 3A and the embodiment of the semiconductor device 100 in FIG. 1A lies in the thickness of the via material 310. As illustrated in FIG. 3A, the via material 310 has a thickness that is greater than that of the via material 110 as illustrated in FIG. 1A.

FIG. 3B illustrates the semiconductor device 300 after removing an upper portion of the via material 310, according to an embodiment of the disclosure. The upper portion of the via material 310 may be removed using a planarization technique performed over the semiconductor device 300.

Due to the pattern density at the first region 102 being higher than that in the second region 104, the removal rate of the via material 310 may be expected to be higher at the first region 102 due to the inherent I/D loading effects induced by the planarization technique. As illustrated in FIG. 3B, the thickness of the remaining via material 310' in the first region 102 is thinner than that in the second region 104. It may be further expected that a portion of the via material 310' remains over the upper surfaces of the dielectric layer 106 after the application of the planarization technique. It may be preferable to have at least a portion of the via material 310' remaining over the dielectric layer 106 such that the underlying dielectric layer 106 may not be eroded from the application of the planarization technique.

The planarization technique employed may include a chemical-mechanical planarization (CMP) process. In an embodiment of the disclosure, the planarization technique may be accomplished by setting a planarization time based on an estimated thickness of the via material 310. By stopping the process before exposing the dielectric layer 106, the relatively abrasive slurry of the CMP process is prevented from damaging the surface of the dielectric layer 106. In another embodiment of the disclosure, the planarization technique may be accomplished using an end-point system. The end-point system can indicate when the platen has removed substantially all the via material 310' over the upper surface of the dielectric layer 106 and has moved into surface-to-surface contact with the dielectric layer 106.

FIG. 3C illustrates the semiconductor device 300 after forming via structures 310" in the openings 108, according to an embodiment of the disclosure. A material removal technique may be employed to remove the residual via material 310' from the upper surfaces of the dielectric layer 106. The material removal technique may include an etching process. The material removal technique employed preferably includes a suitable etchant that is selective to the dielectric layer 106, i.e., the dielectric layer 106 remains predominantly intact during removal of the via material 310' using the material removal technique. As disclosed earlier, it is an aspect of the disclosure that the thickness of the dielectric layer 106 at the first and second regions 102, 104 be predominantly maintained with reduced erosion effects.

The via structures 310" each has a peripheral portion that overlays the sidewalls of the dielectric layer 106 and a central portion that overlays the bottom surface that defined the opening 108; the via structure 310" substantially conforms to the shape of the opening 108. The peripheral portion of the via structures 310" may have a height $H_p$ that is greater than a height $H_c$ of the central portion and a width $W_p$ that is narrower than a width $W_c$ of the central portion. The peripheral portion of via structure 310" may have an upper surface that is substantially level with or lower than the upper surface of the dielectric layer 106. In an embodiment of the disclosure, the via structures 310" may acquire a concave profile or a U-shaped profile in the opening 108.

Similar to the embodiment of the semiconductor device 100 in FIG. 1E, a conductive layer (not shown), that may be analogous to the conductive layer 114 in FIG. 1E, may be fabricated in the first region 102, electrically coupling to the via structures 310" in the openings 108 to form a TFR. The TFR may acquire a non-planar topography; the non-planarity arises at the openings 108 where the TFR overlays the via structures 310".

It may be appreciated by those skilled in the art that the via material 310 may necessarily be deposited to a thickness that is greater than that of the semiconductor devices 100 and 200 disclosed above. As a material removal process may be necessary to remove the residual conductive material from the upper surfaces of the dielectric layer 106 after application of the planarization technique, the via material 310 at the bottom surfaces of the openings 108 may likewise be removed in the process. Therefore, the thickness of the via material 310 at the bottom surfaces of the openings 108 may be greater such that the via structures 310" remains unimpaired so as not to affect the electrical conductivity of the passive device that will be fabricated thereupon.

The embodiments of the semiconductor device 300 as disclosed in FIGS. 3A to 3C optimizes the fabrication process by taking advantage of the relatively high material removal rate and planarity provided by a planarization process while ensuring that the majority of defects caused by the abrasive slurry do not affect the dielectric layer 106. The method as disclosed in FIG. 3C is superior to the planarization process in that etching does not create problems (e.g., scratches, smears, fluting, and erosion) inherent in a planarization process. Moreover, the method presented in FIGS. 3A to 3C advantageously eliminates defects usually introduced to the dielectric layer 106 by an application of a sole planarization process.

Figure 4:
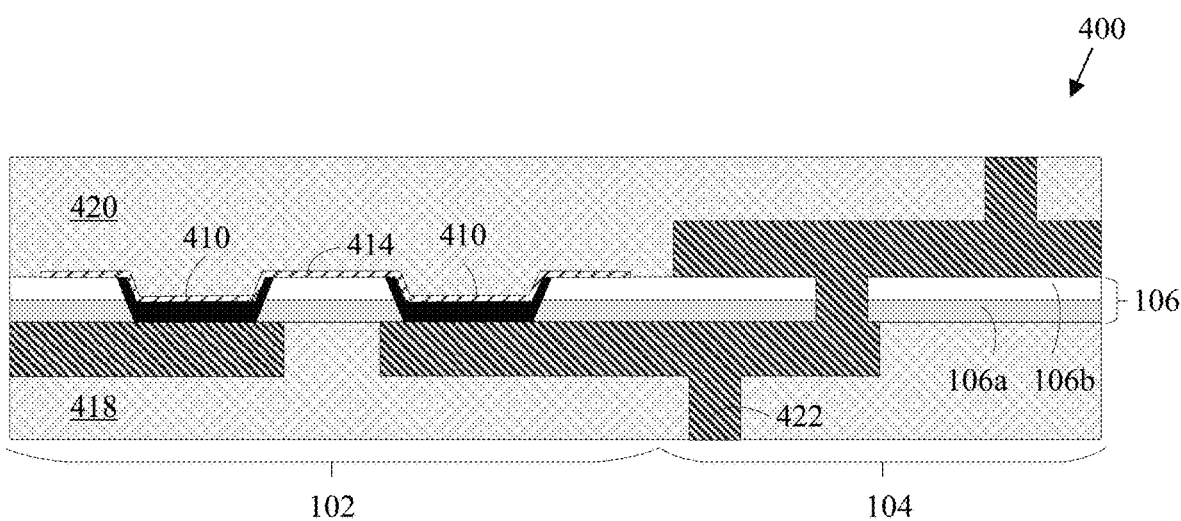
FIG. 4 is a cross-sectional view of a semiconductor device, according to an embodiment of the disclosure.

FIG. 4 is a cross-sectional view of a semiconductor device 400, according to embodiments of the disclosure. The semiconductor device 400 may be part of a semiconductor IC device and may include a first dielectric layer 418, a second dielectric layer 420, interconnect structures 422, and an exemplary embodiment of a TFR 414. The TFR 414 may be fabricated in a back-end-of-line (BEOL) portion of the semiconductor device 400 and in a first region 102 of the semiconductor device 400. A second region 104 of the semiconductor device 400 may be a non-device region having the interconnect structures 422 providing electrical pathways between different regions of the semiconductor device 400. The interconnect structures 422 may include a plurality of interconnect vias and a plurality of interconnect lines and may be fabricated in the first and second dielectric layers 418 and 420.

The TFR 414 may be electrically coupled to the interconnect structures 422 through via structures 410. The via structures 410 may have a concave or a U-shaped profile. The via structures 410 of the TFR 414 may be fabricated in a dielectric layer 106 that is fabricated over the first dielectric layer 418. The dielectric layer 106 may be a multi-layered dielectric stack that may include a first dielectric portion 106a and a second dielectric portion 106b over the first dielectric portion 106a. The first dielectric portion 106a may serve as a capping layer to prevent electro-migration and/or oxidation of conductive material from the interconnect structures 422.

Even though FIG. 4 illustrates the TFR 414 as being electrically coupled to two bottom via structures 410, it is understood that the TFR 414 may take on other configurations without departing from the spirit and scope of the present disclosure. For example, the TFR 414 may be coupled to one bottom via structure 410 and one top via structure (not shown).

As presented in the above disclosure, via structures having improved reliability and methods of forming the same are presented. The via structures may have a concave profile or a U-shaped profile in a dielectric layer. The via structures provide electrical pathways for passive semiconductor devices that may be fabricated thereupon.

By using the methods disclosed herein, potential erosion of dielectric material at a high pattern density region, i.e., the region where the passive device is fabricated in, may be reduced by minimizing the inherent VD loading effects that resulted from regions of varying pattern density over the semiconductor device. The reliability of the via structures, and accordingly the reliability of passive device fabricated thereupon, may be advantageously improved. Erosion of the dielectric material may induce undesirable defects, e.g., delamination or cracking of the dielectric material, and presents uniformity challenges and adversely affecting the reliability of the passive device fabricated therein.

Additionally, the via structures 110' and 210' disclosed in the embodiments of the semiconductor devices 100 and 200, respectively, may have a thickness that is thinner than that of the via structures 310" in the embodiment of the semiconductor device 300. The fabrication process of the via structures are prone to generate particle defects. For example, during the deposition of the via material, the via material, besides being deposited onto the semiconductor devices, is also being coated onto the walls of the deposition chambers. The via material coating may be prone to delamination and generate particle defects on wafer surfaces during the fabrication process. By enabling a thinner via structure fabrication scheme, preventive maintenance cycles of the deposition chambers may be advantageously extended, resulting in cost-savings for the manufacturer.

Furthermore, the concave/U-shaped profile of the via structure provides a larger surface contact area with the passive device fabricated thereupon, relative to a via structure having a planar topography. The larger surface contact area advantageously lowers the electrical contact resistance, thereby improving the electrical performance of the passive devices fabricated thereupon.

While a TFR has been presented in the above detailed description, it should be appreciated by those skilled in the art that the embodiment of a TFR is only an exemplary example, and is not intended to limit the scope of the disclosure. Rather, the above detailed description will provide a convenient road map for implementation with other passive devices without departing from the spirit and scope of the present disclosure.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device, comprising:
   a first dielectric layer having an opening;
   a conductive via structure in the opening, wherein the conductive via structure has a peripheral portion and a central portion, the peripheral portion having a height greater than a height of the central portion and the height of the central portion is greater than a width of the peripheral portion;
   a conductive resistive layer over and electrically connected to the conductive via structure, wherein the conductive resistive layer conformally overlies a top surface of the central portion and a top surface of the peripheral portion of the conductive via structure;
   a second dielectric layer over the first dielectric layer, the second dielectric layer having a first portion in the opening over the conductive resistive layer and a second portion outside the opening; and
   an interconnect structure under and directly contacting the conductive via structure.

2. The semiconductor device of claim 1, further comprising:
   a first region within which the conductive via structure is arranged; and
   a second region, the second region having a pattern density that is lower than that of the first region; and
   the first dielectric layer is over the first region and the second region, wherein the first dielectric layer at the first region has an upper surface that is substantially level with an upper surface of the first dielectric layer at the second region.

3. The semiconductor device of claim 1, wherein the top surface of the peripheral portion of the conductive via structure is substantially level with an upper surface of the first dielectric layer.

4. The semiconductor device of claim 1, wherein the width of the peripheral portion of the conductive via structure is narrower than that of the central portion.

5. The semiconductor device of claim 1, wherein the conductive via structure comprises a tantalum-containing material.

6. The semiconductor device of claim 1, wherein the conductive resistive layer is a thin film resistor.

7. The semiconductor device of claim 1, wherein the conductive via structure comprises a non-planar upper profile effected by the peripheral portion and the central portion.

8. The semiconductor device of claim 7, wherein the conductive resistive layer comprises a first portion and a second portion, the first portion of the conductive resistive layer at least conforms to the upper profile of the conductive via structure.

9. The semiconductor device of claim 8, wherein the first dielectric layer has an upper surface, and the second portion of the conductive resistive layer overlays and directly contacts the upper surface of the first dielectric layer.

10. The semiconductor device of claim 1, wherein the conductive resistive layer has a first bottom surface overlying an upper surface of the first dielectric layer and a second bottom surface overlying the top surface of the central portion of the conductive via structure, wherein the first bottom surface is over than the second bottom surface.

11. A method of forming a semiconductor device, comprising:
    forming a first dielectric layer having a first region and a second region over a substrate, the first region having an opening;
    forming a conductive via structure in the opening, wherein the conductive via structure has a peripheral portion and a central portion, the peripheral portion having a height greater than a height of the central portion and the height of the central portion is greater than a width of the peripheral portion;
    forming a conductive resistive layer over and electrically connected to the conductive via structure, wherein the conductive resistive layer conformally overlies a top surface of the central portion and a top surface of the peripheral portion of the conductive via structure;
    forming a second dielectric layer over the first dielectric layer, the second dielectric layer having a first portion in the opening over the conductive resistive layer and a second portion outside the opening; and
    forming an interconnect structure under and directly contacting the conductive via structure.

12. The method of claim 11, wherein the formation of the conductive via structure comprises:
    depositing a conductive via material over an upper surface of the first dielectric layer and in the opening; and
    removing a portion of conductive via material over the upper surface of the first dielectric layer to form the conductive via structure in the opening.

13. The method of claim 12, wherein the removal of the portion of conductive via material comprises:
    forming a mask layer over the conductive via material; and
    recessing the mask layer to a height that at most extends to the upper surface of the conductive via material, exposing the portion of conductive via material to be removed to form the conductive via structure in the opening.

14. The method of claim 13, wherein the recessed mask layer forms a mask feature to form the conductive via structure in the opening.

15. The method of claim 13, further comprising depositing a barrier layer between the conductive via material and the mask layer.

16. The method of claim 12, wherein the removal of the portion of conductive via material comprises:
performing a first material removal process to remove a first portion of conductive via material over the first region and the second region; and
performing a second material removal process to remove a second portion of conductive via material over the first region and the second region to form the conductive via structure in the opening.

17. The method of claim 16, wherein the first material removal process is a chemical-mechanical planarization process.

18. The method of claim 16, wherein the second material removal process is an etching process.

19. The method of claim 11, wherein the formation of the conductive resistive layer comprises:
depositing a conductive resistive material over the first dielectric layer and the conductive via structure; and
patterning the conductive resistive material to form the conductive resistive layer, wherein at least a portion of the conductive resistive layer conforms to an upper profile of the conductive via structure.

20. The method of claim 19, wherein the deposition of the conductive resistive material comprises a conformal deposition process.

* * * * *